(12) United States Patent
Yokotani

(10) Patent No.: US 8,558,456 B2
(45) Date of Patent: Oct. 15, 2013

(54) LIGHT EMITTING DEVICE AND ILLUMINATION APPARATUS INCLUDING SAME

(75) Inventor: Ryoji Yokotani, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/456,334

(22) Filed: Apr. 26, 2012

(65) Prior Publication Data

US 2012/0274203 A1    Nov. 1, 2012

(30) Foreign Application Priority Data

Apr. 27, 2011    (JP) ................. 2011-098920

(51) Int. Cl.
*H01L 33/00*    (2010.01)
*F21V 5/00*    (2006.01)

(52) U.S. Cl.
USPC ...... 313/512; 362/800; 362/235; 362/311.02; 362/311.08; 362/311.1

(58) Field of Classification Search
None
See application file for complete search history.

(56) References Cited

U.S. PATENT DOCUMENTS

| 6,800,996 | B2 * | 10/2004 | Nagai et al. | 313/512 |
| 7,319,289 | B2 * | 1/2008 | Suehiro et al. | 313/485 |
| 7,810,956 | B2 * | 10/2010 | Bierhuizen et al. | 362/294 |
| 2004/0190304 | A1 * | 9/2004 | Sugimoto et al. | 362/555 |
| 2006/0175625 | A1 * | 8/2006 | Yokotani et al. | 257/95 |

FOREIGN PATENT DOCUMENTS

| JP | H10-288966 | 10/1998 |
| JP | 2003-124522 | 4/2003 |
| JP | 2003-204083 | 7/2003 |
| JP | 2007-250817 | 9/2007 |
| JP | 2008-135707 | 6/2008 |
| JP | 2010-40861 | 2/2010 |
| JP | 2010-183035 | 8/2010 |
| JP | 2011-14695 | 1/2011 |

* cited by examiner

*Primary Examiner* — Ashok Patel
(74) *Attorney, Agent, or Firm* — Bacon & Thomas, PLLC

(57) ABSTRACT

A light emitting device includes a solid-state light emitting element; and a wavelength converting member made of a transparent resin containing a fluorescent material, the transparent resin being coated on an output surface of the solid-state light emitting element. The wavelength converting member is formed to have a thickness larger in a vertical direction of the solid-state light emitting element than that in a lateral direction of the solid-state light emitting element in a cross section that is parallel to a light output direction of the solid-state light emitting element and have a zenith in the light output direction.

16 Claims, 10 Drawing Sheets

LIGHT OUTPUT DIRECTION

LIGHT EMITTING DEVICE AND ILLUMINATION APPARATUS INCLUDING SAME

FIELD OF THE INVENTION

The present invention relates to a light, emitting device including a plurality of solid-state light emitting elements as a light source, and an illumination apparatus including the light emitting device.

BACKGROUND OF THE INVENTION

Because of their low power consumption, high luminance and high durability, light emitting diodes (LEDs) are in the spotlight as a light source for an illumination apparatus with which incandescent lamps, fluorescent lamps and the like are replaced. However, since a single LED provides less light intensity than a fluorescent lamp, a light emitting device including a plurality of LEDs is used for a general illumination apparatus having LEDs as a light source.

As one example of LED packages for such a type of light emitting device, there has been known an LED package in which a yellow fluorescent-material layer is coated on an LED chip emitting a blue light, wherein the blue light and a yellow light are mixed to thereby realize a white light (see, e.g., Japanese Patent Application Publication No. 2011-014695 (JP2011-014695A)). In addition, as shown in FIG. 10A, there has been proposed an LED package 101 in which an LED chip is coated with a hemispherical resin layer 104 containing a fluorescent material (see, e.g., Japanese Patent Application Publication No. 2008-135707 (JP2008-135707A)). Further, as shown in FIG. 11A, there has been proposed an illumination apparatus 110 in which a plurality of LED packages 101 having respective hemispherical transparent resin parts 104 is arranged and a diffusion and transmission panel 107 is disposed adjacent to the front side of the LED packages 101.

However, in the light emitting device disclosed in JP2011-014695A and JP2008-135707, since an output surface of the yellow fluorescent-material layer mounted on the LED package has a planar or hemispherical shape, the distribution of emitted lights has a high directivity in a light output direction, as shown in FIG. 10B. That is, light intensity in the front direction of the LED package is high while light intensity in the circumferential direction thereof is low. Therefore, even if a reflector is provided to cover the LED package, it is difficult to control the distribution of lights since the amount of lights incident into the reflector is low.

In addition, in the above-mentioned illumination apparatus 110, luminance of portions immediately above the LED packages 101 becomes increased. This results in a non-uniform distribution of luminance at the output surface (the diffusion and transmission panel 107) of the illumination apparatus, thereby resulting in a granule-like distribution of the lights, and causing surface reflection.

SUMMARY OF THE INVENTION

In view of the above, the present invention provides a light emitting device which is capable of widening a light distribution of output lights, providing easy controllability of the light distribution, and preventing non-uniform light distribution, and an illumination apparatus including the light emitting device.

In accordance with an aspect of the present invention, there is provided a light emitting device including a solid-state light emitting element; and a wavelength converting member made of a transparent resin containing a fluorescent material, the transparent resin being coated on an output surface of the solid-state light emitting element. The wavelength converting member is formed to have a thickness larger in a vertical direction of the solid-state light emitting element than that in a lateral direction of the solid-state light emitting element in a cross section that is parallel to a light output direction of the solid-state light emitting element and have a zenith in the light output direction.

The wavelength converting member may be formed to have a vertically long convex shape in the cross section.

The wavelength converting member may be formed to have a vertically long triangular shape in the cross section.

The wavelength converting member may be formed to have a circular shape when viewed from above.

The wavelength converting member may be formed to have an ellipsoidal shape when viewed from above.

The wavelength converting member may have a concave portion formed in a side facing the solid-state light emitting element, and be formed as a thin member having uniform thickness, the concave portion being filled with a transparent resin.

The thin member may be made of a resin member which contains a fluorescent material, the resin member being coated on the transparent resin filled in the concave portion or molded into a cap shape.

In accordance with another aspect of the present invention, there is provided an illumination apparatus including the light emitting device In accordance with the aspects of the present invention, since more lights propagate in the lateral direction of the solid-state light emitting element than in the vertical direction thereof in the cross section of the wavelength converting member, the lights emitted from the wavelength converting member have a so-called pad wing type light distribution curve thereby to widen a light distribution. Further, since more lights propagate in the lateral direction, it is easy to control the light distribution by using a reflector in addition, when the illumination emitting device is incorporated in a lighting apparatus, the light emitting device provides a low directivity, thereby preventing the occurrence of non-uniform light distribution.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1A:
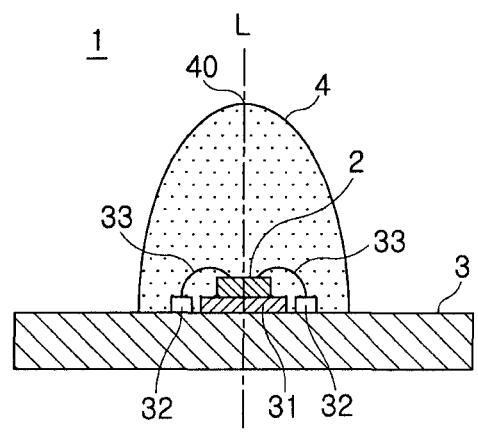
FIGS. 1A and 1B are a side cross sectional view and a plan view of a light emitting device, respectively, in accordance with a first embodiment of the present invention.

Hereinafter, a light emitting device and an illumination apparatus including same in accordance with a first embodiment of the present invention will be described with reference to FIGS. 1A to 4B. In this embodiment, as shown in FIG. 1A, a light emitting device 1 includes a light emitting diode (LED) 2 as a solid-state light emitting element; a wiring board (hereinafter abbreviated as a "board") 3 on which the LED 2 is mounted; and a wavelength converting member 4 made of a transparent resin member containing a fluorescent material, the resin member coating an output surface of the LED 2.

The wavelength converting member 4 is formed to have a thickness larger in a vertical direction of the LED 2 than that in a lateral direction of the LED 2 in a vertical cross section that is parallel to a light output direction of the LED 2 (hereinafter, simply referred to as "vertical cross section"), and includes a zenith 40 in the light output direction of the LED 2. In the following description, a normal line passing through the center of the output surface of the LED 2 is referred to as a light output axis L. In this embodiment, the zenith 40 is located on the light output axis L.

The LED 2 may not be particularly limited as long as it can act as a light source to emit a desired color light for the light emitting device 1. In this example, a GaN blue LED chip to emit a blue light having an emission peak wavelength of 460 nm may be properly used. A size of the LED 2 is also not particularly limited but is preferably □ 0.3 mm. In this embodiment, a so-called face-up type element having both positive and negative electrodes formed on its top surface is used for the LED 2.

As a method of mounting the LED 2, the LED 2 is bonded on the board 3 by means of a die bonding material 31 and the electrodes formed on the top surface of the LED 2 are connected to wiring patterns 32 formed on the board 3 by means of wires 33. Accordingly, the LED 2 is electrically connected to the wiring patterns 32. An example of the die bonding material 31 may include a silicone resin, a silver paste or other high heat-resistant epoxy resins. Although it is here illustrated that the face-up type element is mounted by wire bonding for the mounting of the LED 2, the LED 2 may be a face-down type element, having electrodes formed on its bottom surface, in which case the LED 2 is mounted by, for example, a flip chip mounting method.

For the board 3, a general-purpose board such as a glassy epoxy resin or the like is used as a base material. Alternatively, a ceramic board made of alumina or aluminum nitride or a metal board having an insulating layer formed on its surface may be used for the board 3. The wiring patterns 32 formed on the board 3 are used to supply a power to the LED 2. The board 3 may have a size and a shape as far as the size and the shape are adequate for such members as the LED 2 and the wavelength converting member 4 to be mounted thereon, and a thickness as far as the thickness is adequate to provide strength sufficient to prevent deformation, such as bending, of the board 3 when the board 3 is processed. In case of the LED 2 having the size of □0.3 mm, a board 3 having a square of 40 mm×40 mm per one unit including one LED 2 and one wavelength converting member 4 is used.

The wiring patterns 32 are formed on the board 3 by subjecting an Au surface to a plating treatment. The plating treatment may be carried out on other metal such as Ag, Cu, Ni or the like, instead of Au. In addition, the surface of each wiring pattern is not limited to the single layered structure of Au but may have a stacked structure of for example, Au, Ni and Ag in order to improve the adhesiveness to the board 3. The surfaces of the wiring patterns 32 may be subjected to a light reflection treatment so that lights emitted from the LED 2 to the board 3 can be reflected by the surfaces of the wiring patterns 32.

In addition, the entire surfaces of the board 3 and wiring patterns 32 may be preferably covered with a white resist except regions required for connections of the wires and the mounting of the LED 2. The white resist is formed by, for example, a lift-off method. Thus, the wiring patterns 32 protected by the white resist can result in high stability of the wirings, easy handling in incorporating the light emitting device 1 in the illumination apparatus, and high device manufacturing efficiency.

Examples of the wires 33 may include a general-purpose gold wire, an aluminum wire, a silver wire, a copper wire and so on. The wires 33 are bonded to the electrodes of the LED 2 and the wiring patterns 32 by means of any known bonding method such as thermal bonding, ultrasonic bonding or the like.

In this embodiment, the wavelength converting member 4 is formed to have a vertically long convex shape and a semi-ellipsoidal shape having a major axis in the height direction in the vertical cross section such that the wavelength converting member 4 has the thickness larger in the vertical direction of the LED 2 than that in the lateral direction of the LED 2 in the vertical cross section and includes the zenith 40 in the light output direction of the LED 2. In this embodiment, a length ratio of major axis to minor axis of the wavelength converting member 4 is, example, 2:1 without being limited thereto.

The wavelength converting member 4 is an optical member fabricated by machining a mixed material into the above-mentioned shape, the mixed material being obtained by dispersing a granular yellow fluorescent material, which is excited by the blue light emitted from the LED 2, thereby emitting the yellow light, in a transparent resin (for example, a silicone resin). An example of the transparent resin may include a silicone resin having a refractive index in a range from 1.2 to 1.5.

An example of fluorescent material may include a known yellow fluorescent material which absorbs some of the blue lights emitted from the LED 2 and is excited by the absorbed blue lights and has a peak wavelength in a wavelength range from 500 to 650 nm. The yellow fluorescent material has an emission peak wavelength within a yellow wavelength range and its emission wavelength range includes a red wavelength range.

The yellow fluorescent material is made of crystals of a Garnet structure from composite oxide of yttrium and aluminum. An example of the yellow fluorescent material may include, but is not limited to, a so-called YAG fluorescent material. For example, a mixture of a plurality of color fluorescent materials may be used to adjust color temperature and color rendition. Particularly, a mixture of red fluorescent material and green fluorescent material may be used to obtain a white light having high color rendition. In addition to the above-mentioned fluorescent material, a light diffusing material, a filler and/or the like may be added to the resin material of the wavelength converting member 4.

The wavelength converting member 4 may be formed by, for example, filling a mold molded into the above-described shape with a resin containing a fluorescent material, setting upside down the board 3 on which the LED 2 is mounted on the resin filling the mold, and curing the whole structure. Alternatively, the wavelength converting member 4 may be formed by preparing in advance, by using a resin containing a fluorescent material, a bowl-like mold having a concave portion to serve as a space where the LED 2 is to be disposed, filling the concave portion with the same resin as the mold, loading the mold on the board 3 to cover the LED 2, and curing the whole structure.

As another alternative, a mold of a desired shape may be formed by coating the board 3 on which the LED 2 is mounted with a relatively highly thixotropic resin having fluorescent material by using a dispenser. Further, the thus-formed mold may be subject to cutting and grinding to provide the wavelength converting member 4 having the above-described shape.

Lights emitted from the LED 2 are radially radiated mainly along the direction of the light output axis L. And some of the lights impinge on the fluorescent material contained in the wavelength converting member 4 such that the fluorescent material transitions from a ground state into an excitation state. The excited fluorescent material returns to the ground state when it emits lights having wavelengths different from the wavelengths of the lights emitted from the LED 2. Accordingly, the fluorescent material can emit lights having the wavelengths to which the wavelengths of the lights from the LED 2 are converted.

The lights having the wavelengths resulting from the wavelength conversion caused by the fluorescent material are radiated from the fluorescent material radially instated of being limited to radiate merely along the light output axis L. That is, by the fluorescent material, the lights emitted from the LED 2 are wavelength-converted and are also radially diffused without being limited to propagate along the output axis L direction of the lights emitted from the LED 2. In addition, the wavelength-converted lights may be diffused on surfaces of other fluorescent materials.

In this embodiment, since the wavelength converting member 4 has the thickness larger in the vertical direction of the LED 2 than that in the lateral direction of the LED 2 in the vertical, cross section, lights propagating along the light output axis L of the lights emitted from the LED 2 passes along the longest distance in the wavelength converting member 4. Accordingly, the lights propagating along the light output axis L has just a long distance (optical path) passing through the wavelength converting member 4, and therefore has a high probability for contacting with the fluorescent material, which may obstruct the propagation of the lights along the light output axis L. As a result, when the wavelength converting member 4 has the thickness larger in the vertical direction of the LED 2 than that in the lateral direction of the LED 2 in the vertical cross section, the amount of the lights propagating along the light output axis L is decreased as much.

In addition, the lights having the wavelengths resulting from the wavelength conversion caused by the fluorescent material are outputted, with a distribution of diffused lights (for example, BZ5 in the BZ classification), through an output surface of the wavelength converting member 4. Accordingly, a higher area ratio of the side to the top may provide a wider distribution of lights in the side.

Figure 2:
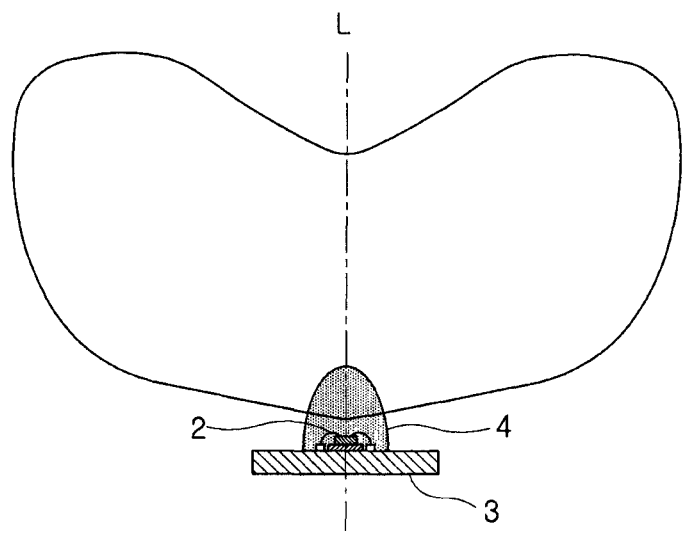
FIG. 2 is a side cross sectional view showing a light distribution curve of the light emitting device.

That is, as shown in FIG. 2, the lights outputted from the wavelength converting member 4 has a so-called pad wing type light distribution curve in which an output light flux in the direction of the light output axis L is low and an output light flux in the lateral direction thereof is high. Accordingly, the light emitting device 1 can widen the distribution of lights emitted from the LED 2 and lower the directivity peculiar to an LED light source.

Figure 3A:
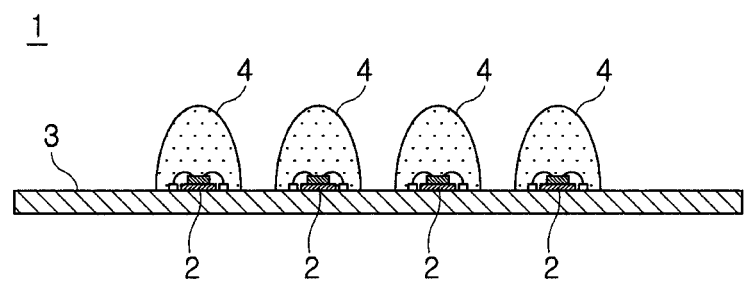
FIGS. 3A and 3B are a side cross sectional view and a plan view showing a structure employing a plurality of solid-state light emitting elements and wavelength converting members, respectively.
Figure 3B:
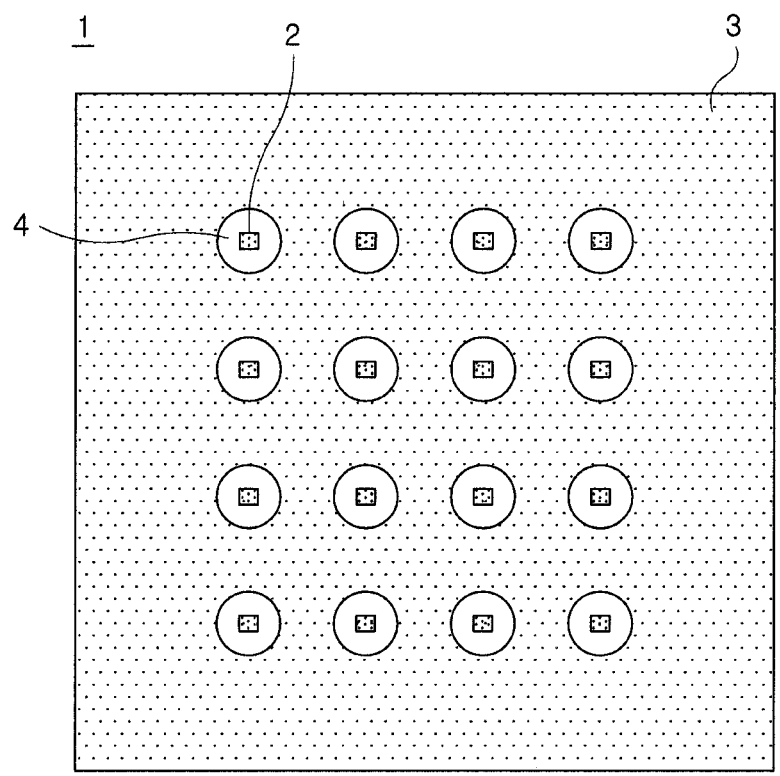

As shown in FIGS. 3A and 3B, in the light emitting device 1, a plurality of LEDs 2 and wavelength converting members 4 is preferably mounted in the form of a matrix on the board 3. Alternatively, without being limited to the matrix form, the LEDs 2 and wavelength converting members 4 may be mounted in the form of a honeycomb or radially on the board 3 (not shown). As another alternative, the LEDs 2 may be mounted in the form of an array on a rectangular board 3 (not shown). Although it is illustrated in this example that the LEDs 2 are coated with respective wavelength converting members 4, the LEDs 2 densely mounted may be coated with a single wavelength converting member 4

Figure 4A:
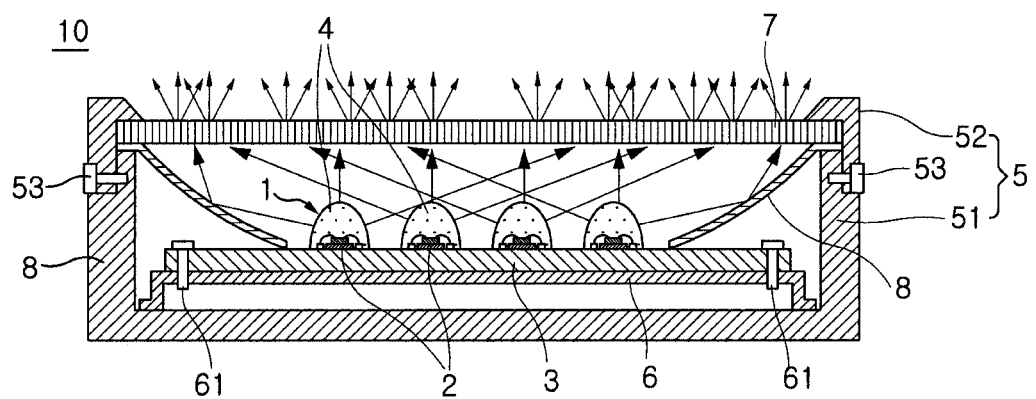
FIGS. 4A and 4B are a longitudinal cross sectional view and a plan view Showing an illumination apparatus incorporating the light emitting device, respectively.
Figure 4B:
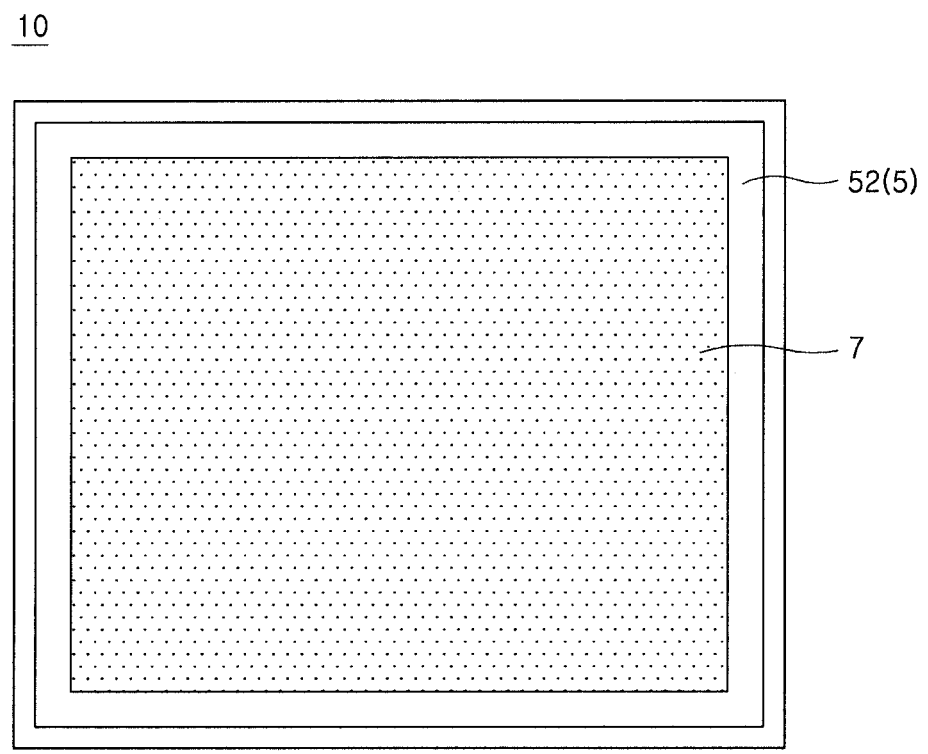

Next, an illumination apparatus 10 incorporating the light emitting device 1 including the plurality of LEDs 2 and wavelength converting members 4 will be described with reference to FIGS. 4A and 4B. The illumination apparatus 10 includes a main body 5; an attachment plate 6 for fixing the light emitting device 1 to the main body 5; a light diffusion and transmission panel (hereinafter abbreviated as a "light diffusion panel") 7 disposed in a light output direction of the light emitting device 1; and a reflector 8 for reflecting lights emitted from the light emitting device 1 toward the light diffusion panel 7.

Although, in this embodiment, the illumination apparatus 10 is illustrated as a square base light, the illumination apparatus 10 is not limited in its shape. For example, the illumination apparatus 10 may be a rectangular base light or a circular down light. The light emitting device 1 incorporated in the illumination apparatus 10 may include one LED 2 and one wavelength converting member 4, as shown in FIG. 1A.

The main body 5 includes an attachment frame 51 having a bottom to which the light emitting device 1 is fixed; and an opening frame 52 attached to an opening of the attachment frame 51 for holding the light diffusion panel 7. The attachment frame 51 is a tubular member having its front side opened and includes a rectangular bottom portion larger than the board 3 and a side portion erected in four sides of the bottom portion in order to receive the light emitting device 1. The side portion of the attachment frame 51 is formed as a female fitting portion having its periphery thinned at the side of the opening.

When a side portion of the opening frame 52 is fitted into the female fitting portion and screws 53 are inserted from the outside, the attachment frame 51 and the opening frame 52 are fixed together. The opening frame 52 is a frame-like member having its center opened to emit lights; and its periphery projecting inward to hold the light diffusion panel 7. The opening of the opening frame 52 is formed to be larger than the size of the board 3 and widened in the light output direction. The attachment frame 51 and the opening frame 52 are made by pressing a plate such as an aluminum plate or a steel plate having a rigidity into a particular shape. An inner side of the attachment frame 51 may be coated with a white paint or the like.

The attachment plate 6 serves to hold the light emitting device 1 and provide a gap between the board 3 of the light emitting device 1 and the bottom of the attachment frame 51, and is made by pressing a plate such as an aluminum plate or a steel plate having a rigidity into the particular shape. The board 3 of the light emitting device 1 and the attachment plate 6 are fixed together by means of through-screws 61. The attachment plate 6 is fixed to the attachment frame 51 by means of screws (not shown), an adhesive or the like. Alternatively, a resin sheet or a stop (not shown) may be inserted between an end of the board 3 and the attachment plate 6 to fix them together.

The attachment plate 6 is preferably made of a material having a high thermal conductivity so that heat from the light emitting device can be efficiently dissipated, and heat dissipating pins may be formed on a surface opposite to the bottom of the attachment frame 51. Accommodated between the board 3 and the bottom of the attachment frame 51 are a power supply, wirings and so on (not shown) for turning on and driving the light emitting device 1. In case where the power supply is separately provided, an installation structure of the light emitting device 1 is not limited thereto. For example, the light emitting device 1 may be directly fixed to the bottom of the attachment frame 51 without having to passing through the attachment frame 6.

The light diffusion panel 7 is a rectangular plate-like member made by machining a milky white material into substantially the same shape as the inside dimension of the opening frame 52, the milky white material being obtained by adding diffusion particles such as titanium oxide particles or the like to a transparent resin such as an acryl resin or the like. In addition, the light diffusion panel 7 may be made by a roughening process for performing sand blasting on a front or rear surface of a transparent glass plate or a resin plate, or a texturing process thereon.

The reflector 8 is a reflective bent plate which surrounds the periphery of the LED 2 and the wavelength converting member 4 disposed on the board 3 in the form of a matrix and is inclined with respect to the light output axis L. As for the reflector 8, a light diffusing reflector is adequately employed, the light diffusing reflector being fabricated by coating a highly reflective white paint on a resin structure having a predetermined shape. If the illumination apparatus 10 is used as a down light, the reflector 8 may have a bowl shape having a surface on which silver or aluminum having a higher reflectivity is deposited.

In the illumination apparatus 10 as configured above, lights emitted from the light emitting device 1 are incident on the light diffusion panel 7 directly or after being reflected by the reflector 8, and then are outputted into the outside of the illumination apparatus 10. At this time, even if the light diffusion panel 7 is disposed adjacent to the light emitting device 1, since the light emitting device 1 emits lights having the pad wing type light distribution as shown in FIG. 2, the directivity of the lights incident on the light diffusion panel 7 becomes decreased. The lights are also diffused and outputted by the light diffusion panel. Accordingly, in the illumination apparatus 10, the lights are emitted from the entire area of the light diffusion panel 7 itself to thereby make the luminance distribution of the light diffusion panel uniform.

In addition, since the light diffusion panel 7 can be closely disposed adjacent to the light emitting device 1, the illumination apparatus 10 can be made thinner. In addition, it is possible to suppress the granule-like distribution peculiar to the LED 2 as the light source from being felt in an output surface of the light diffusion panel 7 of the illumination apparatus 10 to thereby reduce surface reflection.

Figure 1B:
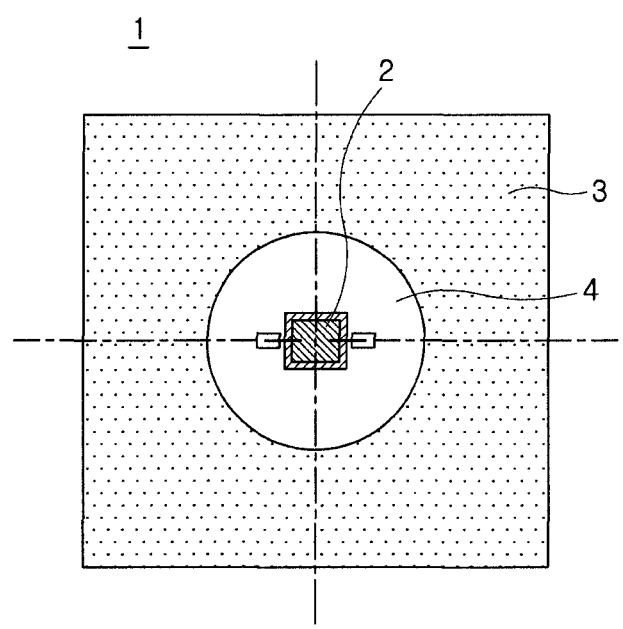

Furthermore, in the light emitting device 1 used for the illumination apparatus 10, since the wavelength converting member 4 has a circular shape when viewed from above, as shown in FIG. 1B, lights are isotropically outputted in the lateral direction of the LED 2. Accordingly, when a plurality of light emitting devices 1 is arranged in the form of a matrix, lights may be irradiated to the light diffusion panel 7 uniformly, thereby making the luminance distribution of the light diffusion panel 7 uniform.

Next, the illumination apparatus 10 in accordance with modifications of the present embodiment will be described with referenced to FIGS. 5A and 5.

Figure 5A:
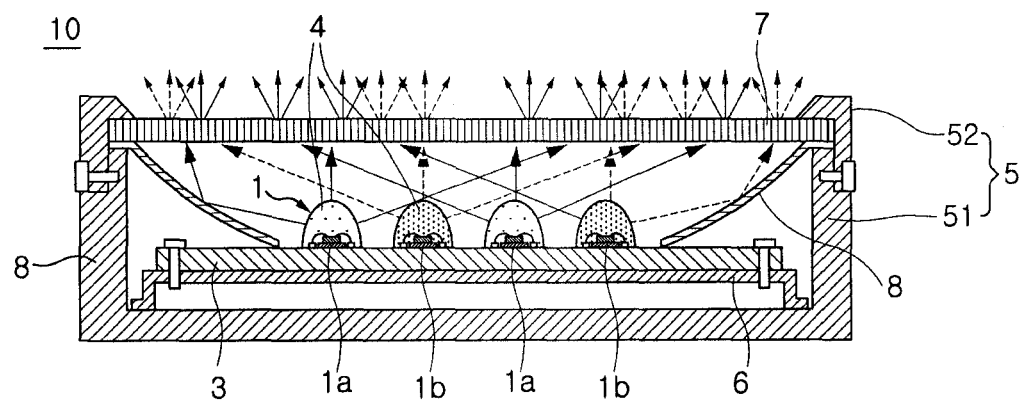
FIGS. 5A and 5B are longitudinal cross sectional views showing different modifications of the illumination apparatus.

In accordance with a first modification as shown in FIG. 5A, the light emitting device 1 includes a different output color. The light color of output lights from the light emitting device 1 is set to a chromaticity by adjusting the kind of a chip used for the LED 2, the kind and/or the amount of the fluorescent material used for the wavelength converting member 4, the kind and/or the amount of pigment or paint, added to the wavelength converting member 4, and the like. The color of irradiating lights of the illumination apparatus 10 may be selected depending on surrounding environments of the illumination apparatus 10. For example, if the illumination apparatus 10 is a general illumination apparatus for living room, it may include a combination of light emitting devices 1a for emitting white lights and light emitting devices 1b for emitting bulb color lights, as shown in the figure.

In conventional LED illumination apparatuses, lights having such different colors may be mixed to a certain degree by the light diffusion panel 7. However, when the light emitting device 1 and the light diffusion panel 7 are closely arranged adjacent to each other, the light mixing may not be sufficiently realized and there may occur non-uniform color distribution at the output surface of the light diffusion panel 7. In contrast, in accordance with this modification, the lights outputted at wide angles from the light emitting devices 1a and 1b are incident on the incident, surface of the light diffusion panel in an overlapping manner and are diffused in the light diffusion panel 7.

Accordingly, a mixture of the white lights and the bulb color lights is uniformly emitted from the output surface of the light diffusion panel 7, thereby preventing the non-uniform color at the illumination apparatus 10. The light colors of the light emitting device 1 are not limited to the above white light and bulb color light. For example, a plurality of light emitting devices for emitting red R, green (G) and blue (B) lights may be used.

Figure 5B:
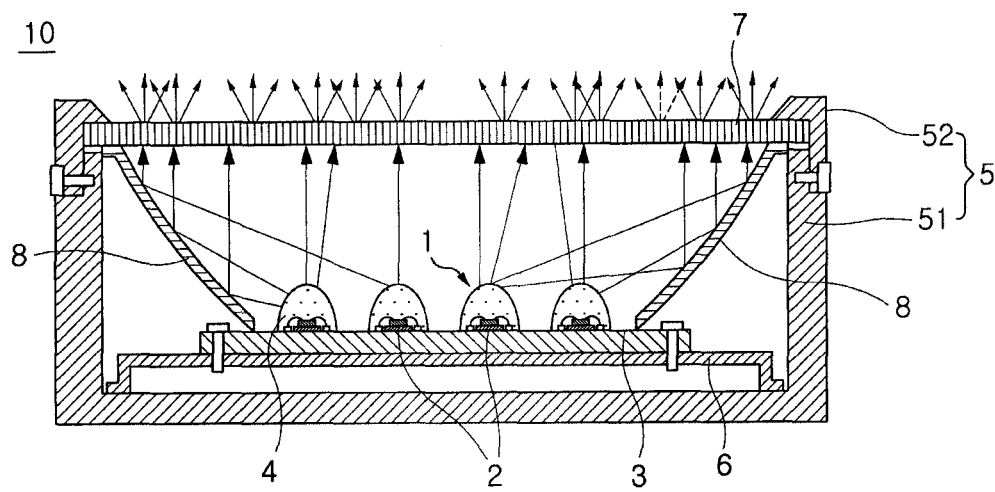

In accordance with a second modification as shown in FIG. 5B, a reflector 8 is provided depending on the kind and use of the illumination apparatus 10. In this modification, down light illumination is assumed and the illumination apparatus 10 includes the reflector 8 larger than that of the above-described embodiment in the light output direction. As described above, since the light emitting device 1 can emit lights at wide angles, when the reflector 8 is provided around the light emitting device 1, more lights become incident on the reflector 8. Accordingly, by adjusting the shape of a reflecting surface of the reflector 8, it is possible to achieve the illumination apparatus with a high controllability of light distribution.

Figure 6A:
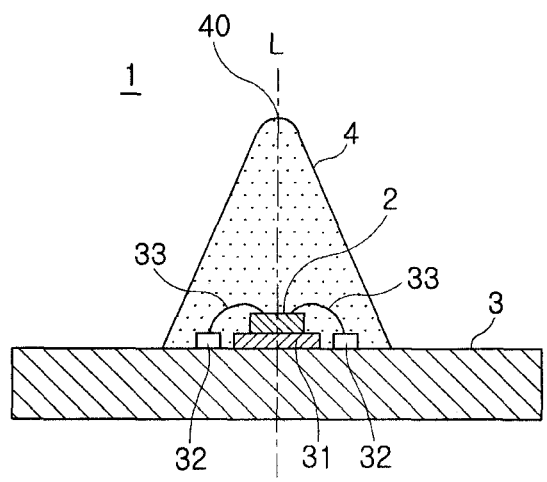
FIGS. 6A and 6B are side cross sectional views showing a light emitting device in accordance with a second embodiment of the present invention and a light distribution of the lights emitted the light emitting device, respectively.
Figure 6B:
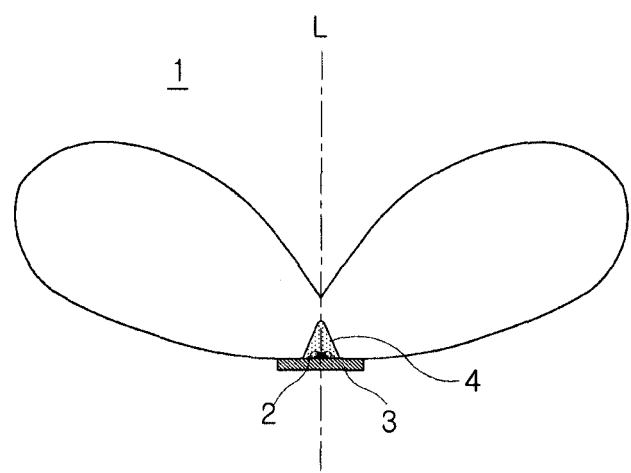

Next, a light emitting device and an illumination apparatus including same in accordance with a second embodiment of the present invention will be described with reference to FIGS. 6A and 6B. A light emitting device 1 of this embodiment includes a wavelength converting member 4 formed to have a vertically long triangular shape in the vertical cross section, as shown in FIG. 6A. A zenith 40 of the wavelength converting member 4 is formed to have a rounded shape instead of spike shape. Other configurations are the same as those of the above first embodiment.

In the wavelength converting member 4, lights propagating in the direction of the light output axis L of the lights emitted from the LED 2 are outputted along a long distance in the wavelength converting member 4 and, therefore, a fluorescent material included in the wavelength converting member 4 may interfere with the lights propagating in the direction of the light output axis L. In addition, lights having wavelengths resulting from wavelength conversion caused by the fluorescent material are outputted, with a distribution of diffused lights (BZ5), through an output surface of the wavelength converting member 4. As a result, an area ratio of the side to the top is further increased as compared to the first embodiment, which results in a more remarkable pad wing light distribution, as shown in FIG. 6B.

With this configuration, in the illumination apparatus 10 including the light emitting device 1, a distance between the light, diffusion panel 7 and the light emitting device 1 can be made smaller and the illumination apparatus 10 can be made thinner, thereby improving the controllability of light distribution by the reflector 8.

Figure 7A:
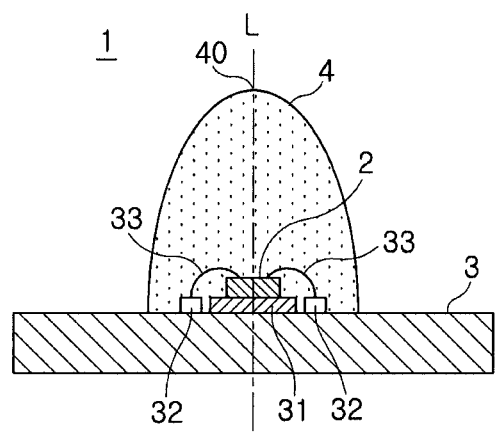
FIGS. 7A and 7B are a side cross sectional view and a plan view showing a light emitting device in accordance with a third embodiment of the present invention.
Figure 7B:
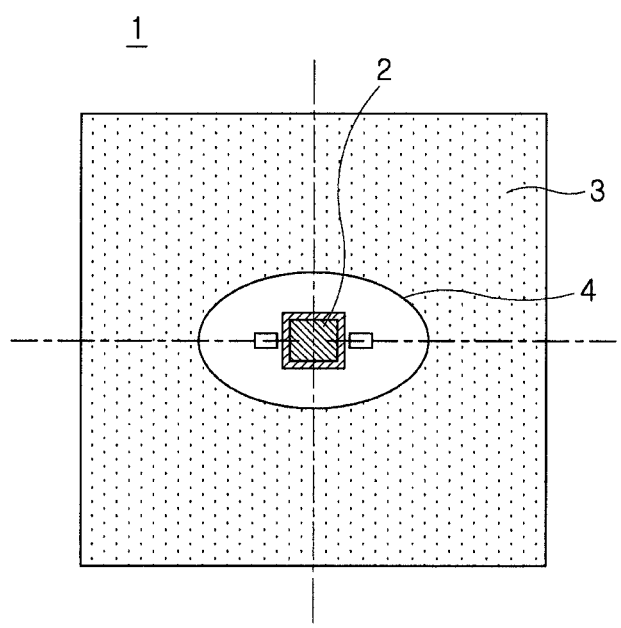

Next, a light emitting device and an illumination apparatus including same in accordance with a third embodiment of the present invention will be described with reference to FIGS. 7 and 8. A light, emitting device 1 of this embodiment includes a wavelength converting member 4 formed to have an ellipsoidal shape when viewed from above, as shown in FIG. 7B, although the wavelength converting member 4 has the same cross section as the first embodiment, as shown in FIG. 7A.

In the wavelength converting member 4 having the ellipsoidal shape when viewed from above, a side area of the wavelength converting member 4 when viewed from the minor axis direction is larger than a side area thereof when viewed from the major axis direction, which results in increase in an output light flux in the minor axis direction over that in the major axis direction.

Figure 8A:
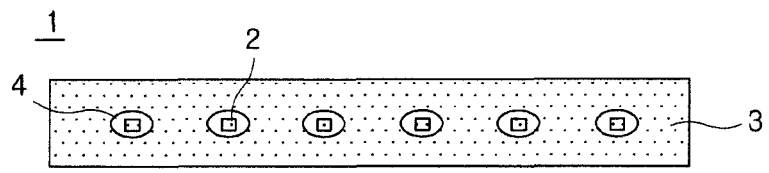
FIGS. 8A to 8D are a plan view showing a structure including a plurality of solid-state light emitting elements and wavelength converting members in the light emitting device, a cross sectional view taken along a longitudinal direction of an illumination apparatus incorporating the light emitting device, a cross sectional view taken along a lateral direction of the illumination apparatus, and a plan view of the illumination apparatus, respectively.
Figure 8B:
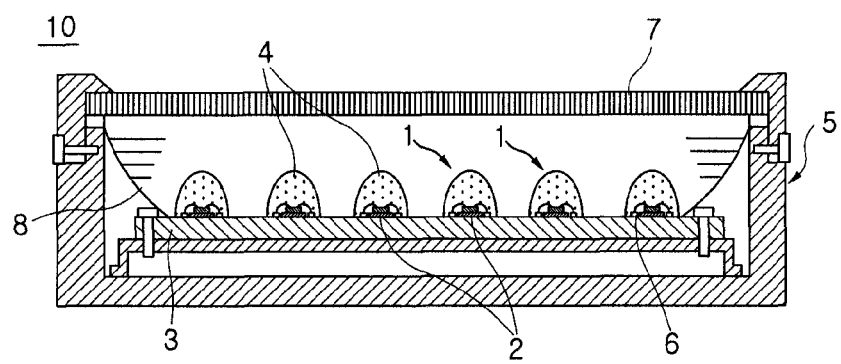
Figure 8C:
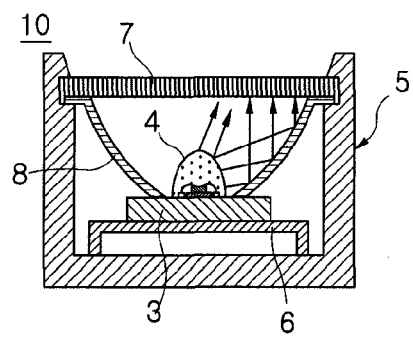
Figure 8D:
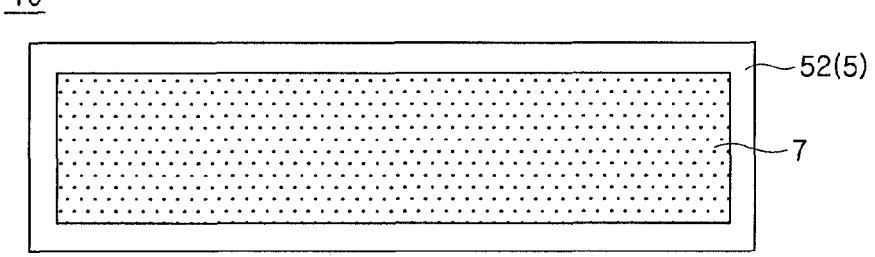

Next, an illumination apparatus 10 incorporating a plurality of light emitting devices 1 including a plurality of LEDs 2 and wavelength converting members 4 will be described with reference to FIGS. 8A to 8D. In this illumination apparatus 10, the light emitting devices 1 are arranged on a long board 3 in the form of an array in a longitudinal, diameter direction of the wavelength converting members 4, as shown in FIG. 8A. In addition, a pair of reflectors 8 is arranged in the longitudinal direction of the long board 3 in such a way that the light emitting devices 1 are interposed between the reflectors 8 as shown in FIGS. 8B to 8C.

A main body 5, an attachment plate 6 and a light diffusion panel 7 are also formed to have a long shape in correspondence to the light emitting devices 1. For example, a shorter side of the Light diffusion panel 7 is formed to be larger than a shorter side of the board 3. Further, in this embodiment, a plurality of arrays of the light emitting devices 1 may be arranged on the board 3 having the square shape as shown in FIGS. 4A and 4B. In addition, the dimension of the board 3 is not particularly limited. For example, the dimension of the board 3 may be 200 mm×20 mm.

In this embodiment, when a plurality of light emitting devices is arranged on the long board 3 in a row with an equal pitch, an amount of lights produced in a direction along a short side of the board 3 can be increased. If an interval between rows of the plurality of light, emitting devices 1 arranged in the form of an array is wide, even when the light diffusion panel 7 is closely disposed adjacent to the light emitting devices 1, it is possible to make a luminance distribution at the output surface of the light diffusion panel 7 uniform without producing non-uniform light distribution for each row.

Figure 9:
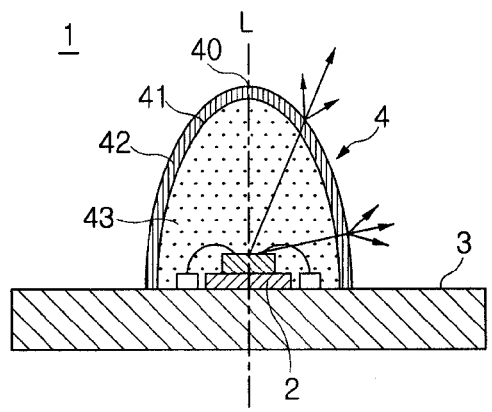
FIG. 9 is a side cross sectional view showing a light emitting device in accordance with a fourth embodiment of the present invention.
Figure 10A:
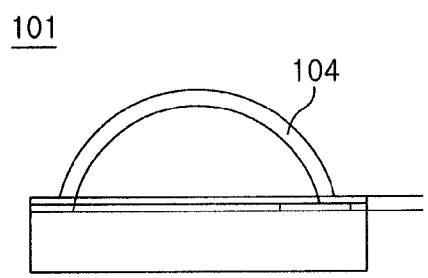
FIGS. 10A and 10B are a side cross sectional view of a conventional light emitting device and a view showing a light distribution curve thereof, respectively.
Figure 10B:
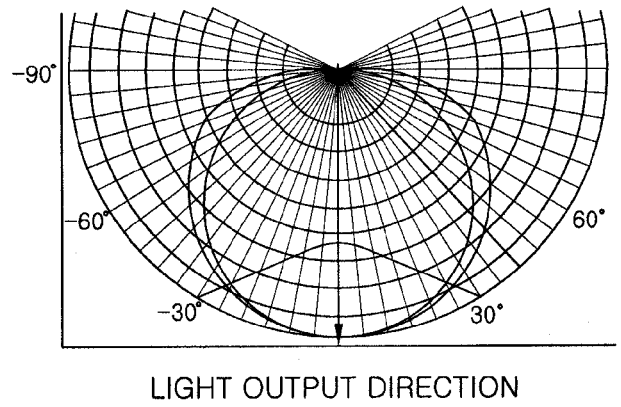
Figure 11A:
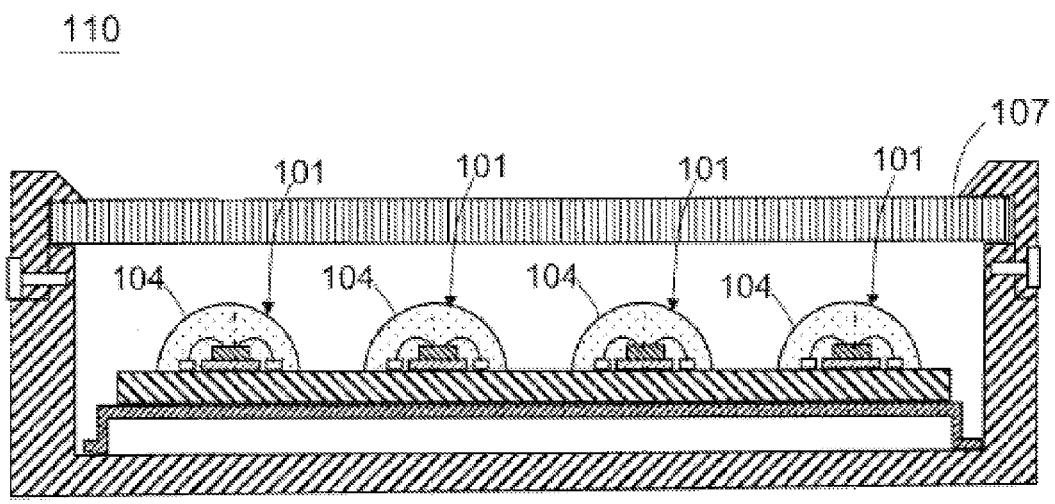
FIGS. 11A and 11B are a longitudinal cross sectional view of an illumination apparatus incorporating a plurality of conventional light emitting devices and a view showing a luminance distribution viewed from above the illumination apparatus, respectively.
Figure 11B:
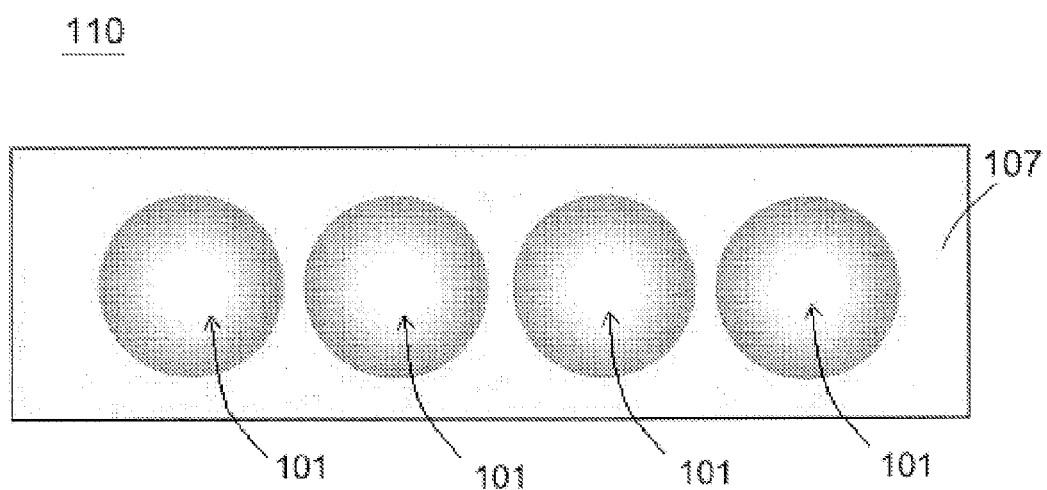

Next, a light emitting device in accordance with a fourth embodiment of the present invention will be described with reference to FIG. 9. In this embodiment, a light emitting device 1 includes a wavelength converting member 4 having a concave portion 41 formed in the side facing an LED 2. The wavelength converting member 4 is formed as a thin member 42 having uniform thickness, the concave portion 41 being filled with a transparent resin 43. The thin member 42 is a member formed by coating the transparent resin 43 with a resin containing a fluorescent material to cover the LED 2, or a resin member containing a fluorescent material molded into a cap shape. Thickness of the wavelength converting member 4 (thin member 42) ranges from 0.1 to 0.5 mm, for example. The transparent resin 43 is the same resin as the thin member 42 except that it contains no fluorescent material. For example, the transparent resin 43 may be a silicone resin. Ether configurations are the same as those of the above-described embodiment.

As described above, if the wavelength converting member 4 has a semi-ellipsoidal shape having a major axis in the height direction, non-uniform color distribution may occur since there occurs a difference between path lengths of lights emitted from the LED 2 in the wavelength converting member 4. In contrast, when the thickness of the wavelength converting member 4 is made thin and uniform, the difference between path lengths of lights in the wavelength converting member 4 (thin member 42) becomes uniform irrespective of the shape of the wavelength converting member thereby preventing the non-uniform color distribution. In addition, it is preferable that the wavelength converting member 4 is formed in a manner to increase the concentration of the fluorescent material in the vicinity of the zenith 40.

Although it has been illustrated in the above embodiments that the wavelength converting member 4 to convert a wavelength of output light from the LED 2 is used to widen a light distribution of the output lights, the present invention is not limited to the disclosed embodiments but may be modified in different ways. For example, a separate optical member to adjust a light distribution may be provided in the outside of the wavelength converting member 4.

While the invention has been shown and described with respect to the embodiments, it will be understood by those skilled in the art that various changes and modifications may be made without departing from the scope of the invention as defined in the following claims.

What is claimed is:
1. A light emitting device comprising:
a solid-state light emitting element; and
a wavelength converting member made of a transparent resin containing a fluorescent material, the transparent resin being coated on an output surface of the solid-state light emitting element,
wherein the wavelength converting member is formed to have a thickness larger in a vertical direction of the solid-state light emitting element than that in a lateral direction of the solid-state light emitting element in a cross section that is parallel to a light output direction of the solid-state light emitting element and have a zenith in the light output direction, and wherein the wavelength converting member is formed to have a vertically long triangular shape in the cross section.

2. The light emitting device of claim 1, wherein the wavelength converting member is formed to have a circular shape when viewed from above.

3. The light emitting device of claim 1, wherein the wavelength converting member is formed to have an ellipsoidal shape when viewed from above.

4. The light emitting device of claim 1, wherein the wavelength converting member has a concave portion formed in a side facing the solid-state light emitting element, and is formed as a thin member having uniform thickness, the concave portion being filled with a transparent resin.

5. The light emitting device of claim 4, wherein the thin member is made of a resin member which contains a fluorescent material, the resin member being coated on the transparent resin filled in the concave portion or molded into a cap shape.

6. An illumination apparatus including the light emitting device of claim 1.

7. A light emitting device comprising:
a solid-state light emitting element; and
a wavelength converting member made of a transparent resin containing a fluorescent material, the transparent resin being coated on an output surface of the solid-state light emitting element,
wherein the wavelength converting member is formed to have a thickness larger in a vertical direction of the solid-state light emitting element than that in a lateral direction of the solid-state light emitting element in a cross section that is parallel to a light output direction of the solid-state light emitting element and have a zenith in the light output direction, and
wherein the wavelength converting member is formed to have an ellipsoidal shape when viewed from above.

8. The light emitting device of claim 7, wherein the wavelength converting member is formed to have a vertically long convex shape in the cross section.

9. The light emitting device of claim 7, wherein the wavelength converting member has a concave portion formed in a side facing the solid-state light emitting element, and is formed as a thin member having uniform thickness, the concave portion being filled with a transparent resin.

10. The light emitting device of claim 9, wherein the thin member is made of a resin member which contains a fluorescent material, the resin member being coated on the transparent resin filled in the concave portion or molded into a cap shape.

11. An illumination apparatus including the light emitting device of claim 7.

12. A light emitting device comprising:
a solid-state light emitting element; and
a wavelength converting member made of a transparent resin containing a fluorescent material, the transparent resin being coated on an output surface of the solid-state light emitting element,
wherein the wavelength converting member is formed to have a thickness larger in a vertical direction of the solid-state light emitting element than that in a lateral direction of the solid-state light emitting element in a cross section that is parallel to a light output direction of the solid-state light emitting element and have a zenith in the light output direction, and
wherein the wavelength converting member has a concave portion formed in a side facing the solid-state light emitting element, and is formed as a thin member having uniform thickness, the concave portion being filled with a transparent resin.

13. The light emitting device of claim 12, wherein the thin member is made of a resin member which contains a fluorescent material, the resin member being coated on the transparent resin filled in the concave portion or molded into a cap shape.

14. The light emitting device of claim 12, wherein the wavelength converting member is formed to have a vertically long convex shape in the cross section.

15. The light emitting device of claim 12, wherein the wavelength converting member is formed to have a circular shape when viewed from above.

16. An illumination apparatus including the light emitting device of claim 12.

* * * * *